(12) United States Patent
Sun

(10) Patent No.: US 8,345,443 B2
(45) Date of Patent: Jan. 1, 2013

(54) SUPPORTING FRAME FOR CIRCUIT BOARD

(75) Inventor: Zheng-Heng Sun, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 380 days.

(21) Appl. No.: 12/697,165

(22) Filed: Jan. 29, 2010

(65) Prior Publication Data
US 2011/0127072 A1 Jun. 2, 2011

(30) Foreign Application Priority Data
Dec. 1, 2009 (CN) .......................... 2009 1 0310736

(51) Int. Cl.
*H05K 7/14* (2006.01)
*H05K 7/02* (2006.01)
*H05K 7/04* (2006.01)
*H05K 7/18* (2006.01)
(52) U.S. Cl. ......... 361/802; 361/807; 361/810; 361/799
(58) Field of Classification Search .................. 361/709, 361/802, 807, 810, 799
See application file for complete search history.

(56) References Cited

U.S. PATENT DOCUMENTS
6,005,775 A * 12/1999 Chiu ............................. 361/752
2008/0089020 A1* 4/2008 Hiew et al. ..................... 361/684

* cited by examiner

*Primary Examiner* — Eric Thomas
*Assistant Examiner* — Arun Ramaswamy
(74) *Attorney, Agent, or Firm* — Altis Law Group, Inc.

(57) ABSTRACT

A circuit board includes a substrate and a supporting frame fixed to, and supporting, the substrate. The supporting frame includes a main body, a pressing supporting portion, two pulling supporting portions and two fixing portions. The main body includes a first arm and a second arm connected to the first arm. The pressing supporting portion extends downwards from a junction of the first arm and the second arm for counterbalancing a downward force applied upon the substrate. The pulling supporting portions respectively extend downwards from distal ends of the first arm and second arm for counterbalancing an upward force applied upon the substrate. The two fixing portions are respectively formed on the first arm and second arm. Each of the fixing portions is located between the pressing supporting portion and one corresponding pulling supporting portion and is closer to the corresponding pulling supporting portion.

7 Claims, 2 Drawing Sheets

SUPPORTING FRAME FOR CIRCUIT BOARD

BACKGROUND

1. Technical Field

The present disclosure relates to supporting frames, and particularly, to a supporting frame for enhancing the stability of a circuit board.

2. Description of Related Art

Generally, sockets are arranged on circuit boards, such as motherboards of computers, for connecting electronic devices to the circuit boards. However, a portion of the circuit board on which the socket is arranged is usually difficult to fix to achieve stability, which can result in the warping of the circuit board during the connecting and disconnecting of the electronic devices.

What is needed, therefore, is a supporting frame for a circuit board to overcome the associated limitations.

DETAILED DESCRIPTION

Figure 1:
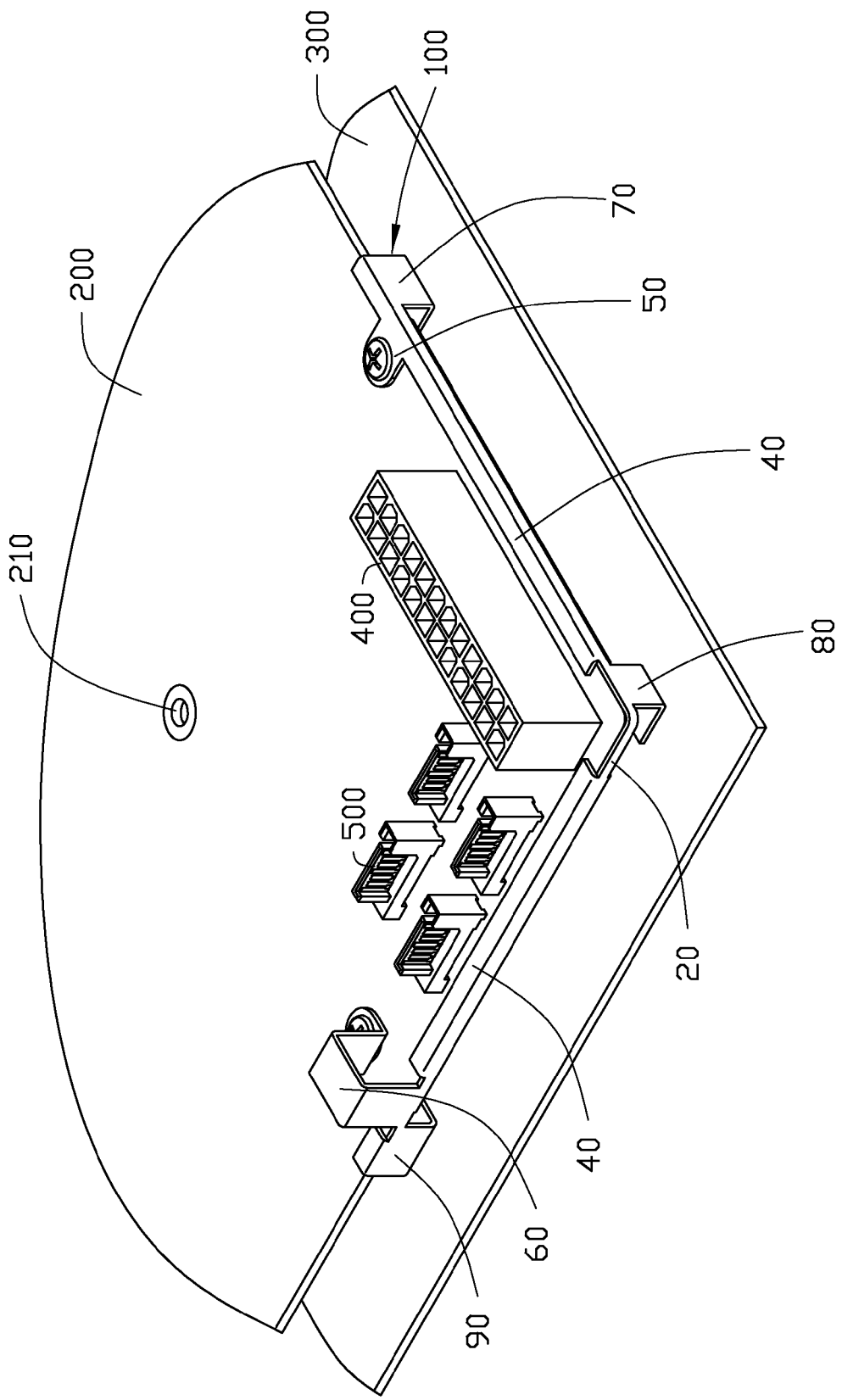
FIG. 1 shows a supporting frame in use, according to an exemplary embodiment.

Referring to FIG. 1, a supporting frame 100 according to an exemplary embodiment is shown. The supporting frame 100 is adapted for enhancing the stability of a circuit board 200, such as a motherboard of a computer.

Figure 2:
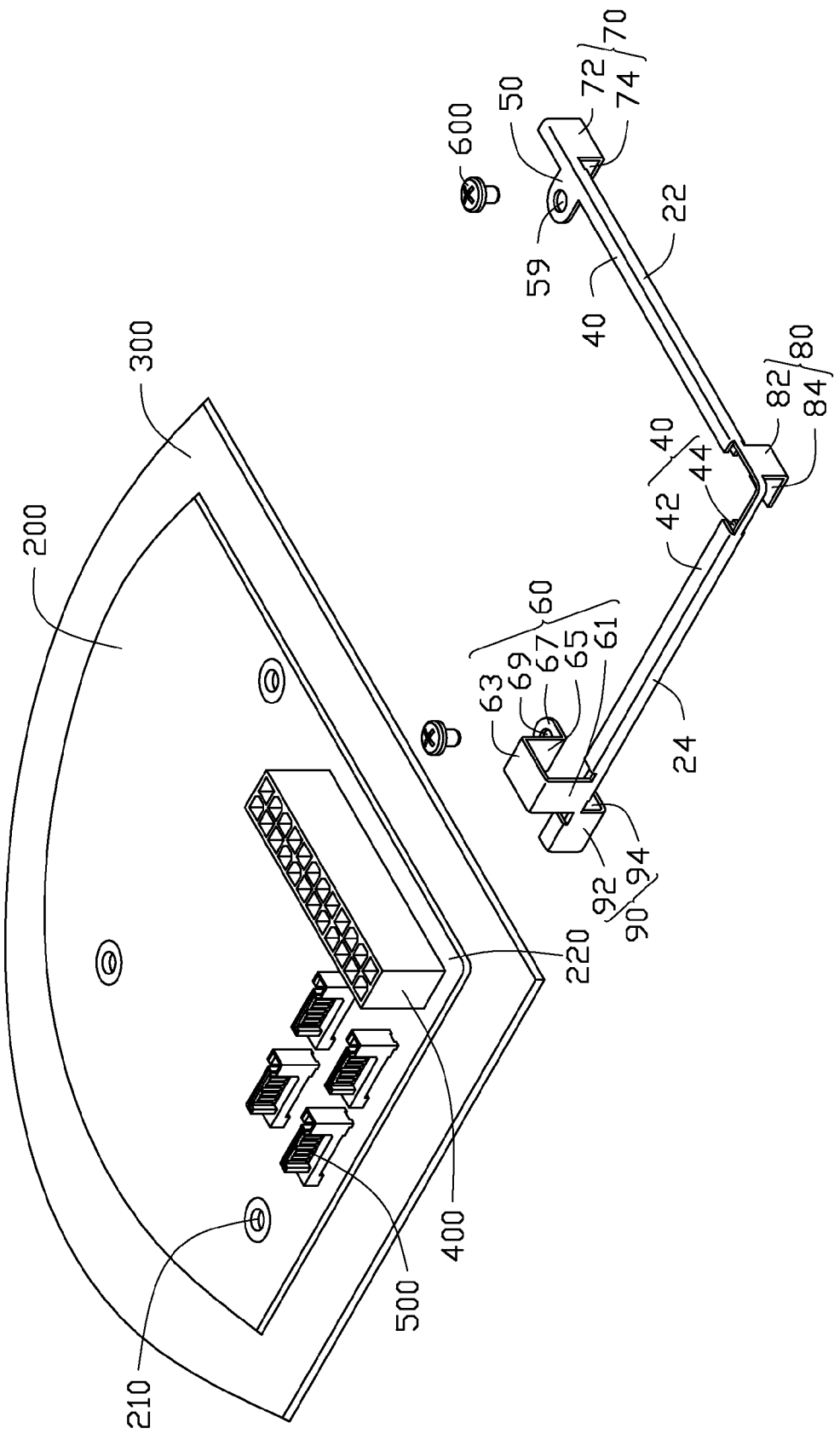
FIG. 2 is an exploded view of FIG. 1.

Referring to FIG. 2, the circuit board 200 includes a number of electronic components 500 and a socket 400 arranged thereon. The socket 400 is arranged at one corner 220 of the circuit board 200. The electronic components 500 are adjacent to the socket 400. A plurality of through holes 210 are defined in the circuit board 200 for bolts that fix the circuit board 200 onto a substrate 300. Two lateral sides of the circuit board 200 are adjacent to the corner 220, each has one through hole 210 defined thereon. In this embodiment, the socket 400 extends along one lateral side, and the electronic components 500 are arranged along the other lateral side of the circuit board 200.

Because the socket 400 is at the corner 220 and the electronic components 500 are adjacent to the corner 220, it is inconvenient to fix the circuit board 200 at the corner 220. To prevent warping from the force used when a connector of an electronic device is pushed into or pulled up from the socket 400, the supporting frame 100 is applied. The supporting frame 100 is made of relatively high intensity metal, and includes a main body 20, two latching portions 40, two fixing portions 50, 60, and three supporting portions 70, 80, and 90.

The main body 20 of the supporting frame 100 is L-shaped, and includes an elongated first arm 22 and an elongated second arm 24 perpendicularly intersecting the first arm 22. The first arm 22 and the second arm 24 are adapted for respectively abutting the two lateral sides of the circuit board 200. A thickness of each of the first arm 22 and the second arm 24 is equal to that of the circuit board 200. Lengths of the first arm 22 and the second arm 24 are determined by positions of the through holes 210 at the lateral sides of the circuit board 200, and each should be longer than a distance between the corner 220 and the through hole 210 of the corresponding lateral side of the circuit board 200.

The three supporting portions of the supporting frame 100 includes a first supporting portion 70 formed at a distal end of the first arm 22, a second supporting portion 80, and a third supporting portion 90 formed at a distal end of the second arm 24. The second supporting portion 80 is formed at an end of the first arm 22, which is connected to the second arm 24. That is, the first supporting portion 70 and the second supporting portion 80 are at opposite ends of the first arm 22.

Each of the three supporting portions 70, 80, 90 includes a connecting plate 72, 82, 92 extending downwards and perpendicularly from the main body 20 and a resisting plate 74, 84, 94 bending inwards from a bottom edge of the connecting plate 72, 82, 92. The connecting plates 72, 82, 92 of the three supporting portions 70, 80, 90 have the same height, and all are equal to a distance between the circuit board 200 and the substrate 300. Each of the resisting plates 74, 84, 94 of the three supporting portions 70, 80, 90 is coplanar with one another, and is parallel to the main body 20. The resisting plates 74, 84, 94 are rectangular, to thereby enlarge a contacting area of the supporting frame 100 and the substrate 300.

The two latching portions 40 of the supporting frame 100 are respectively formed on the first arm 22 and the second arm 24 of the main body 20. Each latching portion 40 is shorter than the corresponding arm 22, 24 of the main body 20, and extends from the distal end of the corresponding arm 22, 24 to a position near but away from the junction of the first arm 22 and the second arm 24. Each of the latching portions 40 includes an upper flange 42 and a lower flange 44 perpendicularly respectively extending from top and bottom edges of the corresponding arm 22, 24 of the main body 20. The upper flange 42 and lower flange 44 of each latching portion 40 are parallel to and spaced from each other. A space is defined between the upper flange 42 and the lower flange 44 of each latching portion 40 for accommodating one corresponding lateral side of the circuit board 200.

The two fixing portions of the supporting frame 100 includes a first fixing portion 50 formed on the first arm 22 and a second fixing portion 60 formed on the second arm 24. The first fixing portion 50 extends outwards from the upper flange 42 of the latching portion 40, and is located between the first supporting portion 70 and the second supporting portion 80. In this embodiment, the first fixing portion 50 is coplanar with the upper flange 42, and adjacent to the first supporting portion 70 relative to the third supporting portion 90. A first mounting hole 59 is defined in the first fixing portion 50 corresponding to the through hole 210 of the one lateral side of the circuit board 200. It should be understood that position of the first fixing portion 50 is determined and should be changed according to that of the through hole 210 of the one lateral side of the circuit board 200.

The second fixing portion 60 of the supporting frame 100 is between the third supporting portion 90 and the second supporting portion 80, and closer to the third supporting portion 90. The second fixing portion 60 includes an outer plate 61, a bridge 63, an inner plate 65, and a mounting plate 67. The outer plate 61 extends perpendicularly and upwards from the upper flange 42 of the latching portion 40 on the second arm 24. The inner plate 65 is parallel to the outer plate 61. The bridge 63 interconnects top edges of the inner plate 65 and the outer plate 61. The mounting plate 67 extends perpendicularly and outwards from a bottom edge of the inner plate 65. The mounting plate 67 is substantially coplanar with the upper flange 42 of the latching portion 40. A second mounting hole 69 is defined in the mounting plate 67 corresponding to the through hole 210 of the other lateral side of the circuit board 200.

When assembled, the supporting frame 100 to the circuit board 200, the junction of the first arm 22 and the second arm 24 of the main body 20 engages the corner 220 of the circuit board 200 with the first arm 22 aligns the one lateral side of the circuit board 200 along with the socket 400 and the second arm 24 facing the other lateral side of the circuit board 200. The upper flange 42 and the lower flange 44 of each latching portion 40, latch between each corresponding lateral side of the circuit board 200. In such a state, the first mounting hole 59 and the second mounting hole 69 respectively align with the through holes 210 of the two lateral sides of the circuit board 200. Screws 600 thus extend through the first and second mounting holes 59, 69 of the supporting frame 100 and the through holes 210 of the two lateral sides of the circuit board 200 to assemble the supporting frame 100 onto the circuit board 200.

When the circuit board 200 with the supporting frame 100 fixed thereon is assembled to the substrate 300, the resisting plates 74, 84, 94 of the three supporting portions 70, 80, 90 abut against the substrate 300 since the heights of the connecting plates 72, 82, 92 of the three supporting portions 70, 80, 90 are equal to the distance between the circuit board 200 and the substrate 300. Thus the supporting frame 100 can counterbalance the force applied on the circuit board 200 to protect the circuit board 200 and the electronic component 500 on the circuit board 200 from being damaged.

More specifically, when the connector of the electronic device is pushed into the socket 400, a downward force is applied to the circuit board 200 to cause the corner 220 of the circuit board 200 with the socket 400 to have a tendency to become concave. However, at the same time, the second supporting portion 80 applies an upward force to the corner 220 to counterbalance the downward force since the resisting plate 84 of the second supporting portion 80 engages the substrate 300. Thus, the warping of the circuit board 200 during the connection of the electric device is avoided, and accordingly, stability and security of the circuit board 200 and the electronic components 500 on the circuit board 200 are maintained.

Alternatively, when the connector of the electronic device is pulled out from the socket 400, an upward force is applied to the corner 220 of the circuit board 200 to cause of the circuit board 200 to have a tendency to become convex. At the same time, the first fixing portion 50 and the second fixing portion 60 function as fulcrums of the first arm 22 and the second arm 24, and thus the first supporting portion 70 on the first arm 22 and the third supporting portion 90 on the second arm 24 each can apply a downward force to the circuit board 200 to counterbalance the upward force. Thus, warping of the circuit board 200 during the disconnecting of the electric device is avoided. Therefore, the circuit board 200 with the supporting frame 100 is stable and secure.

It is to be understood, however, that even though numerous characteristics and advantages of embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A circuit board assembly, comprising:
    a circuit board;
    a substrate; and
    a supporting frame fixed to, and supporting, the substrate, the supporting frame comprising:
        a main body comprising a first arm and a second arm connected to the first arm;
        a pressing supporting portion extending downwards from a junction of the first arm and the second arm for counterbalancing a downward force applied upon the substrate;
        a pulling supporting portion extending downwards from a distal end of each of the first arm and second arm for counterbalancing an upward force applied upon the substrate;
        two fixing portions respectively formed on the first arm and the second arm, each of the fixing portions being located between the pressing supporting portion and one corresponding pulling supporting portion and being closer to the corresponding pulling supporting portion, the fixing portions fixing the supporting frame to the circuit board;
    wherein the fixing portions extend from a top side of the main body, and the pulling supporting portions and the pressing supporting portion extend from a bottom side of the main body;
    wherein the pulling supporting portions and pressing supporting portion are perpendicular to the main body, each of the pulling supporting portions and pressing supporting portion comprising a connecting plate connected to the main body and a resisting plate bending from a bottom of the connecting plate, the resisting plates of the pulling supporting portions and pressing supporting portion being coplanar with one another and abutting against the substrate; and
    wherein the connecting plates of the pulling supporting portions and pressing supporting portion have the same height, and all are equal to a distance between the circuit board and the substrate.

2. The circuit board assembly of claim 1, wherein a mounting hole is defined in each of the fixing portions for fixing the supporting frame to the circuit board.

3. The circuit board assembly of claim 1, wherein a latching portion extends from each of the first arm and the second arm of the main body, the latching portion comprising an upper flange and a lower flange extending from top and bottom edges of main body, a space being defined between the upper and lower flanges of each latching portion for latching a lateral side of the circuit board.

4. The circuit board assembly of claim 3, wherein the fixing portion on the first arm extends outwards from the upper flange and is coplanar with the upper flange.

5. The circuit board assembly of claim 3, wherein the fixing portion on the second arm comprises an outer plate extending upwards from the second arm, an inner plate parallel to the outer plate, a bridge interconnecting top edges of the inner plate and the outer plate, and a mounting plate bending outwards from a bottom edge of the inner plate, the mounting plate being coplanar with a top side of the second arm and defining a mounting hole therein for fixing the supporting frame to the circuit board.

6. The circuit board assembly of claim 3, wherein a thickness of each of the first arm and the second arm is equal to that of the circuit board.

7. The circuit board assembly of claim 6, wherein each latching portion is shorter than the corresponding arm of the main body, and extends from the distal end of the corresponding arm to a position near but away from the junction of the first arm and the second arm.

* * * * *